United States Patent [19]

Ogiue et al.

[11] 4,111,724
[45] Sep. 5, 1978

[54] METHOD OF MANUFACTURING OXIDE ISOLATED SEMICONDUCTOR DEVICE UTILIZING SELECTIVE ETCHING TECHNIQUE

[75] Inventors: Katumi Ogiue; Hiroyuki Kondo, both of Tokyo; Takashi Ishikawa, Kodaira; Takaaki Mori, Ome; Takahisa Nitta, Fuchu, all of Japan

[73] Assignee: Hitachi, Ltd., Japan

[21] Appl. No.: 750,387

[22] Filed: Dec. 14, 1976

[30] Foreign Application Priority Data

Dec. 22, 1975 [JP] Japan .................................. 50-151828

[51] Int. Cl.$^2$ ..................... H01L 21/76; H01L 21/306
[52] U.S. Cl. ................................. 148/175; 29/576 W; 29/578; 29/580; 148/1.5; 148/187; 156/643; 156/648; 156/653; 156/657; 156/662; 357/49; 357/50; 357/54
[58] Field of Search .................. 148/1.5, 175, 187; 29/576 W, 578, 580; 156/643, 648, 653–657, 662; 357/49, 50

[56] References Cited

U.S. PATENT DOCUMENTS

| | | | |
|---|---|---|---|
| 3,759,761 | 9/1973 | Mori et al. ........................ | 156/648 |
| 3,886,004 | 5/1975 | Bruchez ............................. | 148/187 |
| 3,933,540 | 1/1976 | Kondo et al. ..................... | 148/187 |
| 3,962,779 | 6/1976 | Edwards et al. .................. | 29/578 X |
| 4,002,511 | 1/1977 | Magdo et al. ..................... | 148/187 |
| 4,005,453 | 1/1977 | Le Can et al. .................... | 357/50 X |
| 4,008,107 | 2/1977 | Hayasaka et al. ................. | 148/175 |
| 4,023,195 | 5/1977 | Richman ........................... | 357/50 X |
| 4,038,110 | 7/1977 | Feng ................................. | 148/175 X |
| 4,044,454 | 8/1977 | Magdo ............................... | 29/578 |

*Primary Examiner*—R. Dean
*Assistant Examiner*—W.G. Saba
*Attorney, Agent, or Firm*—Craig & Antonelli

[57] ABSTRACT

In the production of a semiconductor integrated circuit device including a selective oxidation step at a high temperature using a nitride film as a mask for isolating respective element regions in a semiconductor wafer with oxidized regions, electrode contact regions and active regions are successively formed in each element region to be surrounded by the oxidized regions and thin oxide films are formed on exposed surfaces of the electrode contact regions, the thin semiconductor oxide films are removed simultaneously by immersed etching, and then electrode metal layers are formed thereon. The thickness of the oxide layer on which the electrode metal layers are formed is maintained almost uniform to ensure the isolation effect. Since a buried region in each element region is required only to make partial contact with the contact region at the bottom portion, the integration density of the elements in the integrated circuit can be increased.

5 Claims, 14 Drawing Figures

METHOD OF MANUFACTURING OXIDE ISOLATED SEMICONDUCTOR DEVICE UTILIZING SELECTIVE ETCHING TECHNIQUE

BACKGROUND OF THE INVENTION

1. Field of the Invention

This invention relates to production of semiconductor devices and more particularly to a semiconductor device in which respective element regions are isolated by the semiconductor oxide and the method of manufacturing the same.

2. Description of the Prior Art

In production of semiconductor integrated circuit (IC) devices, respective element regions should be effectively isolated from each other. Oxide isolation utilizing an oxide of the semiconductor material as the isolating means has become a widely adopted technique in place of the conventional pnjunction isolation. For example, see U.S. Pat. No. 3,648,125. This oxide isolation provides an advantage that the occupation area of the isolating region can be reduced compared to the pn-conjunction isolation and hence the integration (packaging) density of the IC can be improved.

The isolating oxide region may be formed by the selective oxidation process at a high temperature utilizing a nitride film as the mask or by the anodic oxidation process in an electrolytic solution in which the oxide film is made porous and oxidation is continued through this porous film. According to the conventional technique of forming bipolar transistors in an IC, however, there is a drawback that in forming a heavily doped collector contact or sink region and making an ohmic semiconductor-metal contact through a window formed in a semiconductor oxide layer the peripheral portion of oxidized isolation regions adjacent to the heavily doped region may often be over-etched in the photoetching process for opening the collector window in the oxide layer and hence the protection effects such as high breakdown voltage or isolation by the oxidized regions may be deteriorated.

Then, the collector contact region may be short-circuited with the substrate or the leak current of the collector region may increase. Further, due to the partial thinning of the oxidized isolation regions there may be formed sharp steps in the oxidized isolation regions abutting the collector contact region. Such sharp steps may produce electrical cut-off or opening in the metal wiring layer formed thereon or pinholes or cracks in insulating layers in the case of multi-layer interconnection. Thus, the yield or the reliability of the products is greatly decreased.

SUMMARY OF THE INVENTION

This invention is made to solve the above problems and therefore an object of this invention is to provide a novel production of a semiconductor device which can achieve perfect isolation by a semiconductor oxide layer.

Another object of this invention is to provide a structure of a semiconductor IC device provided with oxide isolation and capable of increasing the integration density.

According to an aspect of this invention, there is provided a method of manufacturing a semiconductor device comprising the steps of (a) selectively forming a first semiconductor oxide layer in a first conductivity type semiconductor region, (b) forming a first heavily doped region of a second conductivity type in and extending to the surface of said first conductivity type region surrounded by said first semiconductor oxide layer and forming simultaneously a second semiconductor oxide layer at least on the surface of said first heavily doped region, (c) forming a second region of said second conductivity type in a surface portion of said first conductivity type region, except the first heavily doped region of the second conductivity type, and surrounded by said first semiconductor oxide layer, and forming simultaneously a third semiconductor oxide layer at least on the surface of said second region of said second conductivity type, (d) simultaneously removing said second and third semiconductor oxide layers away from the surface of said first conductivity type region, and (e) forming conducting layers on the surface of said first and second regions of said second conductivity type.

According to another aspect of this invention, there is provided an oxide isolation and protection structure in a semiconductor integrated circuit device comprising a first semiconductor region, a second semiconductor region formed on said first semiconductor region and electrically divided into a plurality of regions with a semiconductor oxide layer, heavily doped buried regions of the opposite conductivity type to that of said first semiconductor region, formed in said first semiconductor region, and intervening between said first and second semiconductor regions, and semiconductor elements each formed in a region of said second semiconductor region and surrounded by said semiconductor oxide layer, the structure comprising a contact region of the same conductivity type as that of said buried region, extending to the surface of said second region and at least partially connected with said buried region at the bottom portion.

Other objects, features and advantages of this invention will become apparent from the following detailed description of the preferred embodiments when taken in conjunction with the accompanying drawings.

BRIEF DESCRIPTION OF THE DRAWINGS

FIG. 1K' is a cross-section of a semiconductor device according to a modification of this invention.

DESCRIPTION OF THE PREFERRED EMBODIMENTS

FIGS. 1A through 1K show how a bipolar type integrated circuit according to an embodiment of this invention is manufactured.

Figure 1A:
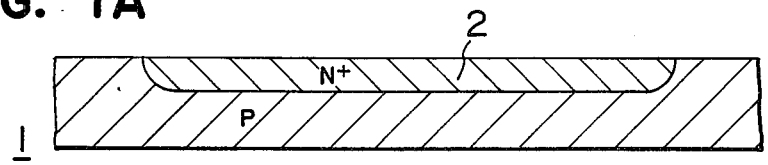
FIGS. 1A to 1K are cross-sections showing respective manufacturing steps of a semiconductor device according to an embodiment of this invention.

(A) First, a P-type silicon substrate 1 having a specific resistivity of 10 to 20 $\Omega$ cm is prepared and arsenic is selectively diffused from one principal surface to form an N$^+$-type region 2 having a depth of about 1.5$\mu$ and a surface resistivity of about 15 $\Omega/\square$ (see FIG. 1A). This heavily doped region 2 serves to reduce the collector resistance.

Figure 1B:
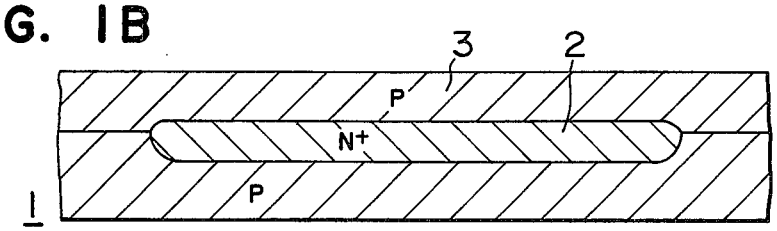

(B) The silicon substrate 1 is subjected to a heat treatment at about 1150° C. for several minutes in an atmosphere containing silicon tetrachloride (SiCl$_4$) and diborane (B$_2$H$_6$) to grow a P-type epitaxial layer 3 having a thickness of about 1.5$\mu$ and a specific resistivity of about 0.3 Ωcm. The N+-type region 2 is thereby buried by the P-type epitaxial layer 3. Here, due to the outdoping or outdiffusion of impurities by the thermal effect of said epitaxial growth step, the N+-type region extends into the P-type epitaxially grown layer 3 by the order of about 0.3μ (FIG. 1B).

Figure 1C:
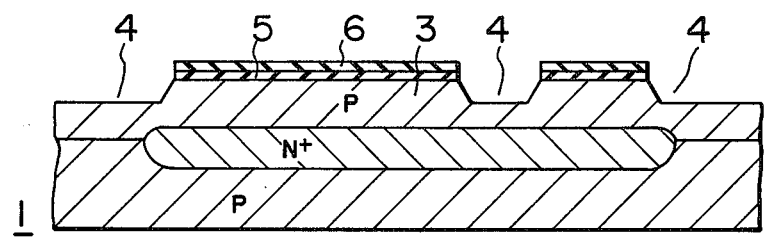

(C) For the following oxidation process, the P-type epitaxially grown layer 3 except those portions for forming active regions and contact regions (for forming ohmic contact with metal electrodes) is selectively etched away by the use of the photomasking technique to form recessed portions 4 of a depth of about 0.6μ. More particularly, this process is carried out as follows. First, the substrate 1 is subjected to a heat treatment at about 1000° C. for 30 minutes in an oxidizing atmosphere to grow an oxide ($SiO_2$) layer 5 of about 1200 Å on the substrate surface. Then, the substrate 1 is subjected to another heat treatment at about 850° C. for 6 minutes in an atmosphere containing monosilane ($SiH_4$) and ammonia ($NH_3$) to form a silicon nitride ($Si_3N_4$) layer 6 of about 1500 A on said oxide layer 5. Then, the silicon nitride layer 6 is selectively removed away by the plasma etching of Freon gas using a photoresist mask. Then using this nitride layer 6 as the mask, the oxide layer 5 is selectively etched away in a mixture liquid of one part of fluoric acid (HF) and ten parts of fluoric ammonium ($NH_4F$) by volume ratio to expose a predetermined pattern of the substrate surface which is to be subjected to the following etching treatment. Using the remaining nitride layer 6 as the mask, the p-type epitaxially grown layer 3 is subjected to a selective etching treatment in a mixture liquid of 200 parts of nitric acid ($HNO_3$) and one part of fluoric acid (HF) by volume to form said recessed portion 4 (FIG. 1C).

Figure 1D:
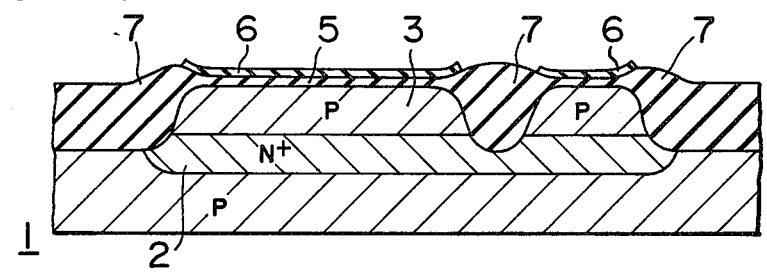

(D) With the nitride layer 6 remaining on said substrate 1, the substrate 1 is subjected to a heat treatment at about 1000° C. for ten and several hours in an oxidizing atmosphere, e.g., wet $O_2$. By this oxidation, only the exposed surface of said recessed portion 4 is subjected to an intense oxidation and an oxide ($SiO_2$) layer 7 of about 1.8μ grows thereon. This oxide layer 7 is arranged to grow by thermal oxidation to such a depth as to completely contact with said buried N+-type region 2 at the bottom (FIG. 1D).

Figure 1E:
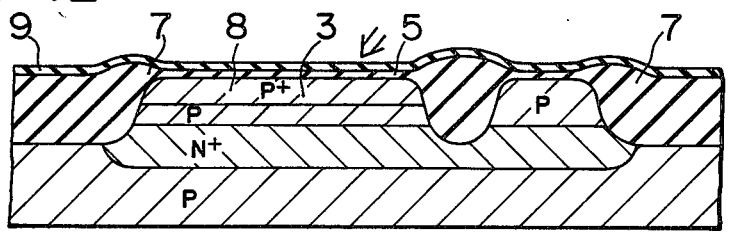

(E) Using the photomasking process the nitride layer 6 and the underlying oxide layer 5 are removed away in a portion surrounded by the thick oxide layer 7, for example in the portion indicated by the arrow in FIG. 1E, to expose the P-type epitaxial layer 3 thereat. Then, boron is diffused from the exposed surface into the P-type layer to form a P+-type base region 8 having a depth of about 0.6μ and a surface resistivity of about 520 Ω/□. This diffusion process comprises a deposition step of depositing boron impurity in the form of an oxide on the exposed surface and a diffusion step of thermally diffusing boron from the boron oxide deposit into the substrate (P-type layer 3) in an oxidizing atmosphere. In the latter step, the exposed surface is covered with an oxide layer 5 of a thickness of about 1200 A (similar thickness with other thin oxide layers). Then, the substrate 1 is immersed in boiling phosphoric acid ($H_3PO_4$) solution to remove the remaining silicon nitride layer 6. Then, the substrate 1 is heat-treated at about 410° C. for ten minutes in an atmosphere containing monosilane ($SiH_4$) and phosphorus hydrogenate ($PH_3$) to grow a phosphosilicate glass (PSG) layer 9 of about 4000 A thereon (FIG. 1E).

Figure 1F:
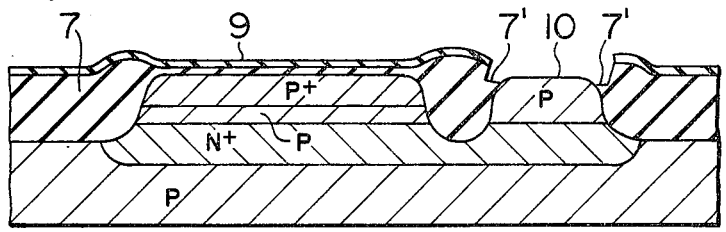

(F) For forming a heavily doped region for contacting a collector electrode, a predetermined region of the PSG layer 9 and the underlying oxide layer 5 is removed away to expose part of the substrate surface 10 under which the heavily doped region for collector contact will be formed. Namely, the surface of the PSG layer 9 except said predetermined area is masked with a photolithographic photoresist film using a known photoetching technique and the substrate is immersed in a mixture liquid of fluoric acid and fluoric ammonium as described above to etch away the PSG layer 9 and the oxide layer 5 and expose the surface 10 (FIG. 1F). In this etching treatment, end portions 7' of the thick oxide layer 7 which is difficult to be precisely masked by the above-mentioned photoresist film will be etched deeper to a depth of about 0.5μ.

Figure 1G:
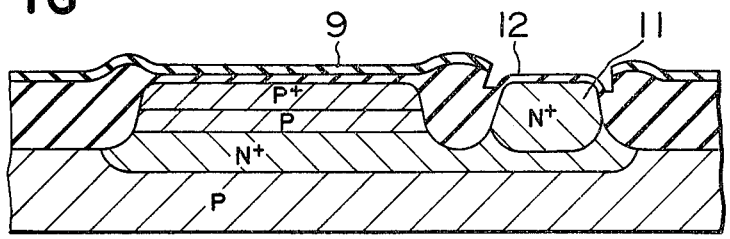

(G) The substrate 1 is subjected to a heat treatment in an atmosphere containing phosphorus to diffuse phosphorus from the exposed surface 10 into the substrate to form an N+-type region 11 of about 2.5μ thick which serves as a collector contact region. This diffusion process includes a deposition step of depositing phosphorus impurity in the form of an oxide on the substrate surface by maintaining the substrate at about 1000° C. for one hour in an atmosphere containing phosphorus and a thermal diffusion step of maintaining the substrate in an oxidizing atmosphere at about 1000° C. for 30 minutes to diffuse phosphorus from the above-mentioned deposit into the substrate and form N+-type region 11. Namely, the P-type epitaxial layer 10 in the collector contact region is fully compensated and converted into N+-type by this phosphorus doping. Here, in the latter step of thermal diffusion, a thin oxide ($SiO_2$) film 12 of about 500 Å thick is grown on the surface of this N+-type region 11 (FIG. 1G).

Figure 1H:
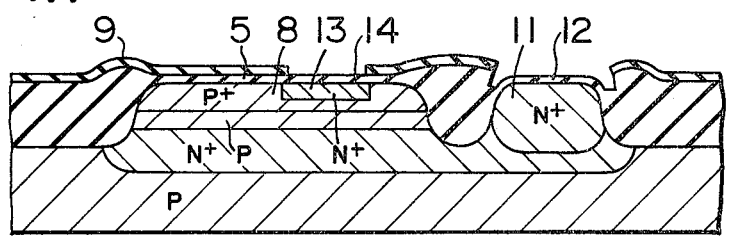

(H) The PSG layer 9 and the underlying oxide layer 5 on part of the P+-type base region 8 are selectively etched away by the photoetching technique to expose part of the base region 8. Arsenic is diffused from this exposed surface to form an N+-type emitter region 13 having a thickness of about 0.4μ and a surface resistivity of about 17 Ω/□. This diffusion process is carried out by a heat-treatment using an ampoule of aresenic impurity at about 1000° C. for two hours. Here, a thin oxide film 14 of about 500 Å is grown on the exposed surface (FIG. 1H).

Figure 1I:
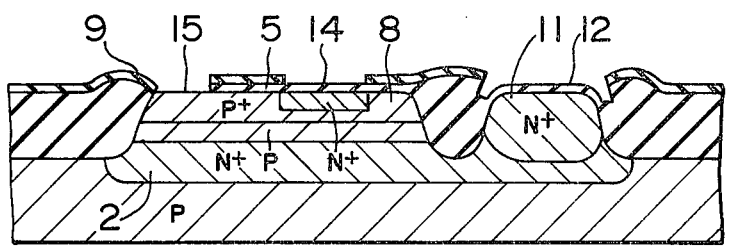

(I) The PSG film 9 and the underlying oxide films in the area for forming a base contact are selectively removed by the photoetching technique to expose surface 15 of the P+-type base region 8 (FIG. 1I).

Figure 1J:
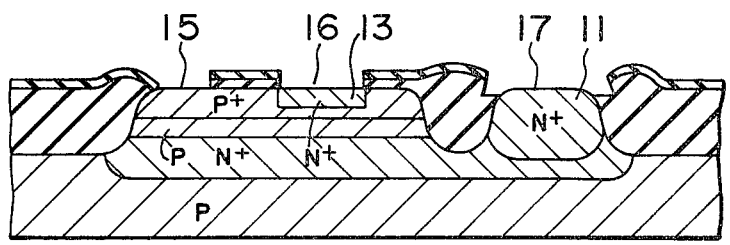

(J) Then, the substrate 1 is immersed in a mixture liquid of one part of fluoric acid and ten parts of fluoric ammonium by volume for about 30 seconds. Here, no etching mask is provided on the substrate surface. Thus, the oxide layer existing on the substrate surface is etched at a uniform rate. The thin silicon oxide films 12 and 14 on the collector contact region 11 and the emitter region 13 are completely removed away to expose surfaces 16 and 17 (FIG. 1J). It can be seen that the process steps I and J are for opening windows 15, 16 and 17 to form electrode contacts. Here, it is to be noted that photomasking is only needed for opening the base window 15.

Figure 1K:
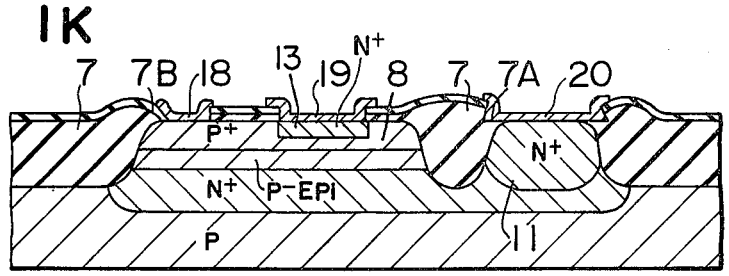
Figure 1K:
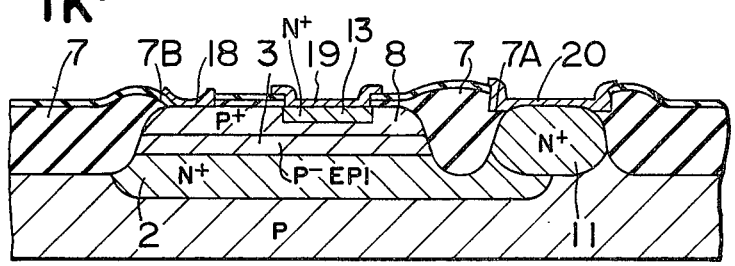

(K) Respective metal contacts 18, 19 and 20 are formed on the exposed substrate surface to form electrical lead-out of the base, emitter and collector regions 8, 13 and 11 (FIG. 1K). This may be achieved by depositing a conducting layer, e.g. of aluminium, on the whole substrate surface and then removing unnecessary portions by photoetching.

The buried N$^+$-type region 2 may be designed to terminate beneath the collector contact region 11 as shown in FIG. 1K'. By adopting this structure, the occupation area of an element decreases by about 20% compared to the conventional case and hence the integration density or packaging density can be improved.

An NPN-type transistor isolated by oxidized regions is provided by the above processes.

According to the above processes and the above structure, the window in an oxide film for forming the collector contact therethrough can be formed simultaneously with that for emitter contact after the emitter diffusion process by simple immersion etching or plasma etching without the need for photoetching or mask alignment. Thereby, unnecessary excess etching at the edge of the isolating oxide layer can be prevented and hence the excess thinning of the isolating oxide layer can be prevented to achieve the desired isolation by said oxide layer.

Figure 2A:
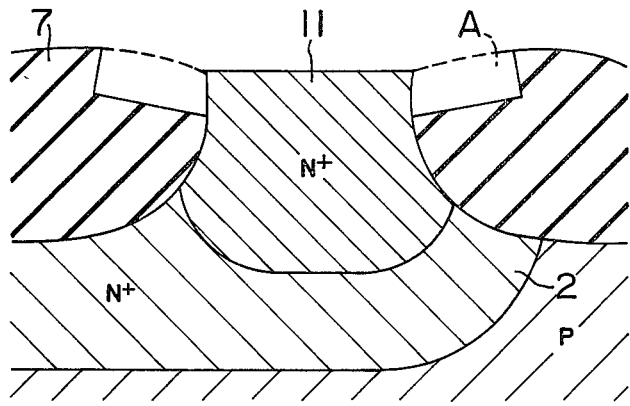
FIGS. 2A and 2B are cross-sections illustrating the problems encountered in manufacturing an oxide-isolated semiconductor device according to the conventional technique.

Regarding the point of forming a collector contact window through an oxide film, according to the conventional method, an oxide film is first photoetched to diffuse an N$^+$-type collector contact region 11 as shown in FIG. 2A. Here, due to the inevitable error in the positioning accuracy the isolating oxide layer 7 is partially excessively etched away (about 0.5$\mu$) as shown in the portion A. Another photoetching is carried out possibly on this excessively etched portion for opening a collector contact window due to the similar reason to further etch away the portion B (about 0.5$\mu$). Thereby, the oxide layer may be partially etched away excessively to a depth of 1.0$\mu$ (A + B). Then, the isolation effect of the oxide layer may be decreased to a considerable amount.

Figure 2B:
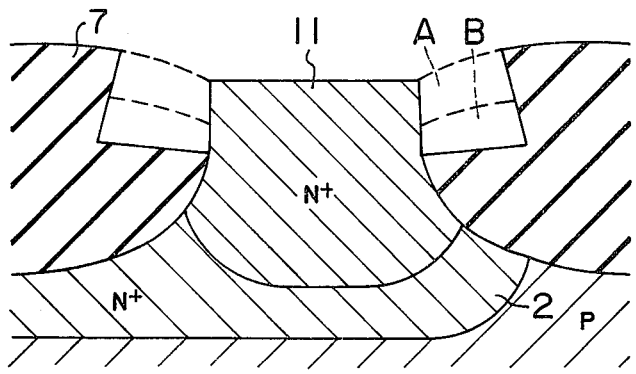

According to the present invention, the window for collector contact is formed by simple immersion etching or plasma etching. There is no need for considering the error in positioning accuracy for registering a photolithographic mask. Therefore, there is no possibility that the part B shown in FIG. 2B may be excessively etched away. As a result, the thicknesses of the oxide layer in the edge portions 7A and 7B of the isolating oxide layer 7 adjacent to the collector contact region 11 and the base region 8 in FIGS. 1K and 1K' becomes almost equal. Thereby, the isolation effect by the oxide film has become perfect.

Further, since the impurity such as phosphorus used for diffusing the collector contact region is also diffused from the rear surface of the substrate, there is another advantage that this impurity atoms exhibit gettering effect for the heavy metal atoms such as chromium or aluminium which forms a factor for producing lattice defects in silicon.

When this invention is applied to a multi-layered wiring structure, the thickness of the oxide film is not unnecessarily thinned and hence there is no danger of generating pin holes or cracks or also of cutting off electrical connections at step edges.

Although each single example of the manufacturing conditions and usages is described in the foregoing description, they are not limited to those described hereinabove and may be applied in various ways. For examples, the conductivity types of the respective regions may be reversed, the kinds of impurity atoms and the methods of growing oxide films may be arbitarily altered and the present invention may be applied also to I$^2$L (Integrated Injection Logic) circuits utilizing the isoplanar method and n-channel enhancement/depletion MOS circuits utilizing local oxidation of silicon.

What is claimed is:

1. A method of manufacturing a semiconductor device comprising the steps of:
   (a) selectively forming a first semiconductor oxide layer in a semiconductor region of a first conductivity type;
   (b) forming a first heavily doped region of a second conductivity type in and extending to the surface of said first conductivity type region surrounded by said first semiconductor oxide layer and forming simultaneously a second semiconductor oxide layer at least on the surface of said first heavily doped region;
   (c) forming a second region of said second conductivity type in a surface portion of said first conductivity type region, except the first heavily doped region of the second conductivity type, surrounded by said first semiconductor oxide layer, and forming simultaneously a third semiconductor oxide layer at least on the surface of said second region of the second conductivity type;
   (d) simultaneously removing said second and third semiconductor oxide layers away from the surface of said first conductivity type region; and
   (e) forming conducting layers on the surface of said first and second regions of the second conductivity type.

2. A method of manufacturing a semiconductor device according to claim 1, in which said step of simultaneously removing said second and third semiconductor oxide layers is performed by immersion etching.

3. A method of manufacturing a semiconductor device according to claim 1, wherein said first conductivity type region in which said first semiconductor oxide layer is selectively formed is formed by epitaxial growth on the surface of a semiconductor substrate of the same conductivity type.

4. A method of manufacturing a semiconductor device according to claim 3, wherein said step of forming said first heavily doped region of the second conductivity type is achieved by heavily doping a second conductivity type impurity into a region in said epitaxially grown region of the first conductivity type surrounded by said first semiconductor oxide layer.

5. A method of manufacturing a semiconductor integrated circuit device comprising the steps of:
   (a) selectively forming a first heavily doped region of a first conductivity type in the surface portion of a semiconductor substrate of a second conductivity type;
   (b) growing an epitaxial layer of said second conductivity type on the surface of said substrate and thereby burying said first heavily doped region;

(c) selectively etching away said epitaxial layer to form recessed portions and selectively oxidizing said epitaxial layer in said recessed portions to form oxidized regions extending to the substrate, thereby forming respective element regions isolated from each other by said oxidized regions and at least one element region having a main region and an electrode contact region surrounded by said oxidized region and electrically connected to said main region through said buried first heavily doped region;

(d) selectively diffusing impurities into said main region to form a second semiconductor region of said second conductivity type and a third semiconductor region of said first conductivity type and into said electrode contact region to convert the conductivity type and form an electrode contact region of said first conductivity type extending to said buried region and forming simultaneously oxide films on exposed surfaces, said third semiconductor region and said electrode contact region being covered with oxide films of smaller thickness than those of other portions;

(e) opening a window in said oxide film on said second semiconductor region;

(f) uniformly etching away the oxide film to a predetermined depth so that said thin oxide films on said third semiconductor region and said electrode contact region are exposed: and (g) forming metal electrodes on the exposed semiconductor surface and on the remaining oxide film.

* * * * *